(12) United States Patent
Sugiyama

(10) Patent No.: US 10,551,556 B2
(45) Date of Patent: Feb. 4, 2020

(54) LIGHT SOURCE DEVICE AND LIGHT SOURCE UNIT COMPRISING THE SAME

(71) Applicant: Japan Display Inc., Tokyo (JP)

(72) Inventor: Ken Sugiyama, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/385,604

(22) Filed: Apr. 16, 2019

(65) Prior Publication Data

US 2019/0257998 A1 Aug. 22, 2019

Related U.S. Application Data

(63) Continuation of application No. 15/658,095, filed on Jul. 24, 2017, now Pat. No. 10,310,174.

(30) Foreign Application Priority Data

Jul. 29, 2016 (JP) .................................. 2016-149573
Jun. 1, 2017 (JP) .................................. 2017-109469

(51) Int. Cl.

| F21V 8/00 | (2006.01) |
|---|---|
| H01L 33/48 | (2010.01) |
| H01L 33/58 | (2010.01) |
| H01L 33/62 | (2010.01) |
| H05K 1/14 | (2006.01) |
| H05K 1/02 | (2006.01) |
| H05K 1/18 | (2006.01) |
| H01L 25/075 | (2006.01) |
| G02F 1/1333 | (2006.01) |

(52) U.S. Cl.

CPC ............ *G02B 6/009* (2013.01); *G02B 6/0051* (2013.01); *G02B 6/0053* (2013.01); *G02B 6/0055* (2013.01); *G02B 6/0068* (2013.01); *G02B 6/0073* (2013.01); *G02B 6/0083* (2013.01); *H01L 25/0753* (2013.01); *H01L 33/486* (2013.01); *H01L 33/58* (2013.01); *H01L 33/62* (2013.01); *H05K 1/0274* (2013.01); *H05K 1/147* (2013.01); *H05K 1/181* (2013.01); *G02F 1/1333* (2013.01); *H05K 2201/10106* (2013.01); *H05K 2201/10136* (2013.01); *H05K 2201/10681* (2013.01)

(58) Field of Classification Search

CPC ..... G02B 6/009; G02B 6/0055; G02B 6/0083
USPC .................................................... 362/249.02
See application file for complete search history.

(56) References Cited

U.S. PATENT DOCUMENTS

| 2006/0060867 | A1 | 3/2006 | Suehiro |
| 2016/0018583 | A1 | 1/2016 | Lee et al. |
| 2016/0154172 | A1 | 6/2016 | Komano et al. |
| 2017/0286044 | A1* | 10/2017 | Kim ...................... H01L 33/504 |

FOREIGN PATENT DOCUMENTS

JP 2015-079579 A 4/2015

* cited by examiner

*Primary Examiner* — Toan C Ly

(74) *Attorney, Agent, or Firm* — Michael Best & Friedrich LLP

(57) ABSTRACT

According to one embodiment, a light source device includes a light-emitting chip, and a case in which the light-emitting chip is accommodated. The case includes a light-emitting surface which transmits light from the light-emitting chip, and a plurality of sidewalls extending so as to intersect the light-emitting surface. At least a part of the sidewalls is colored or painted in black.

8 Claims, 10 Drawing Sheets

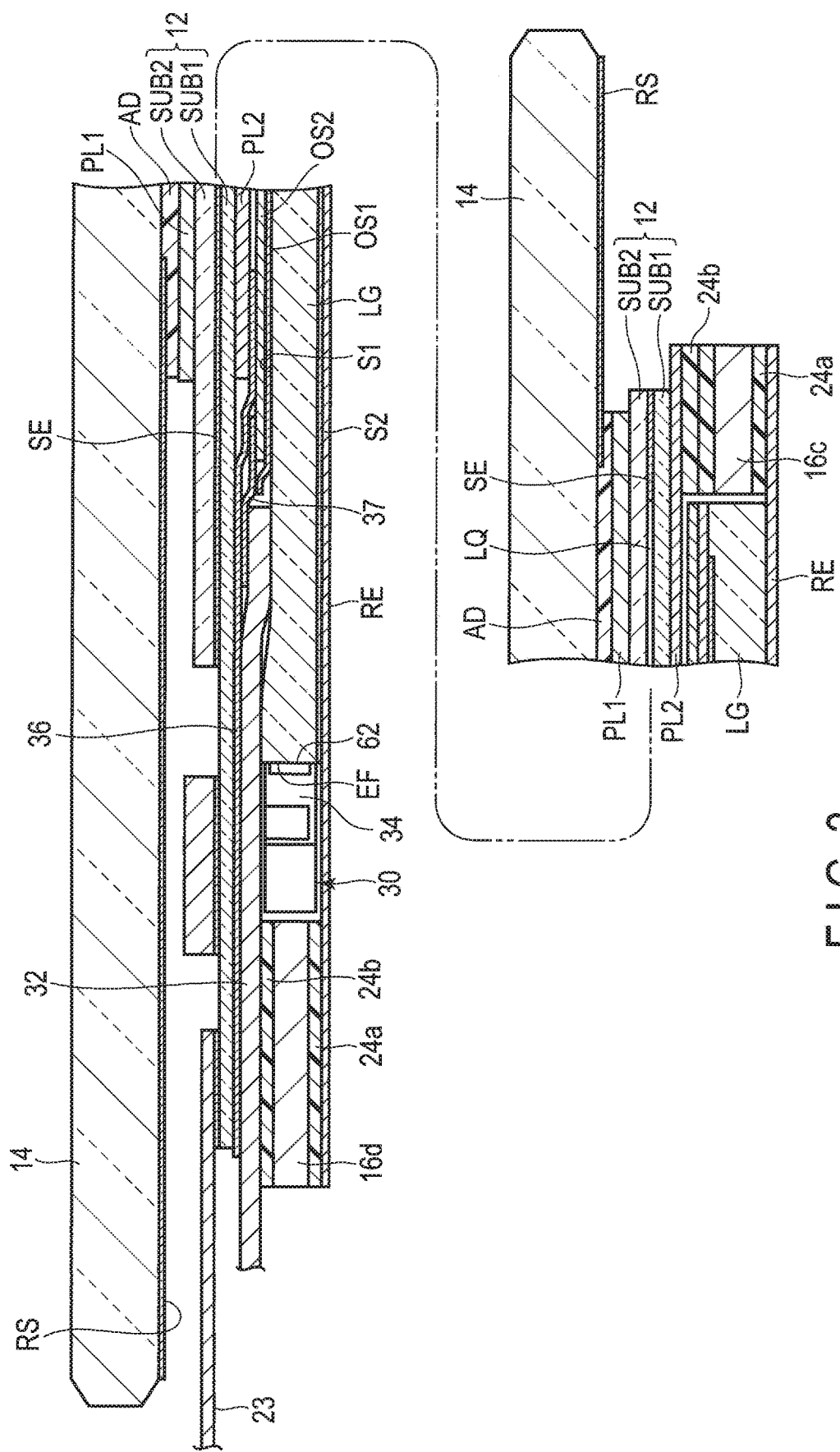
F I G. 3

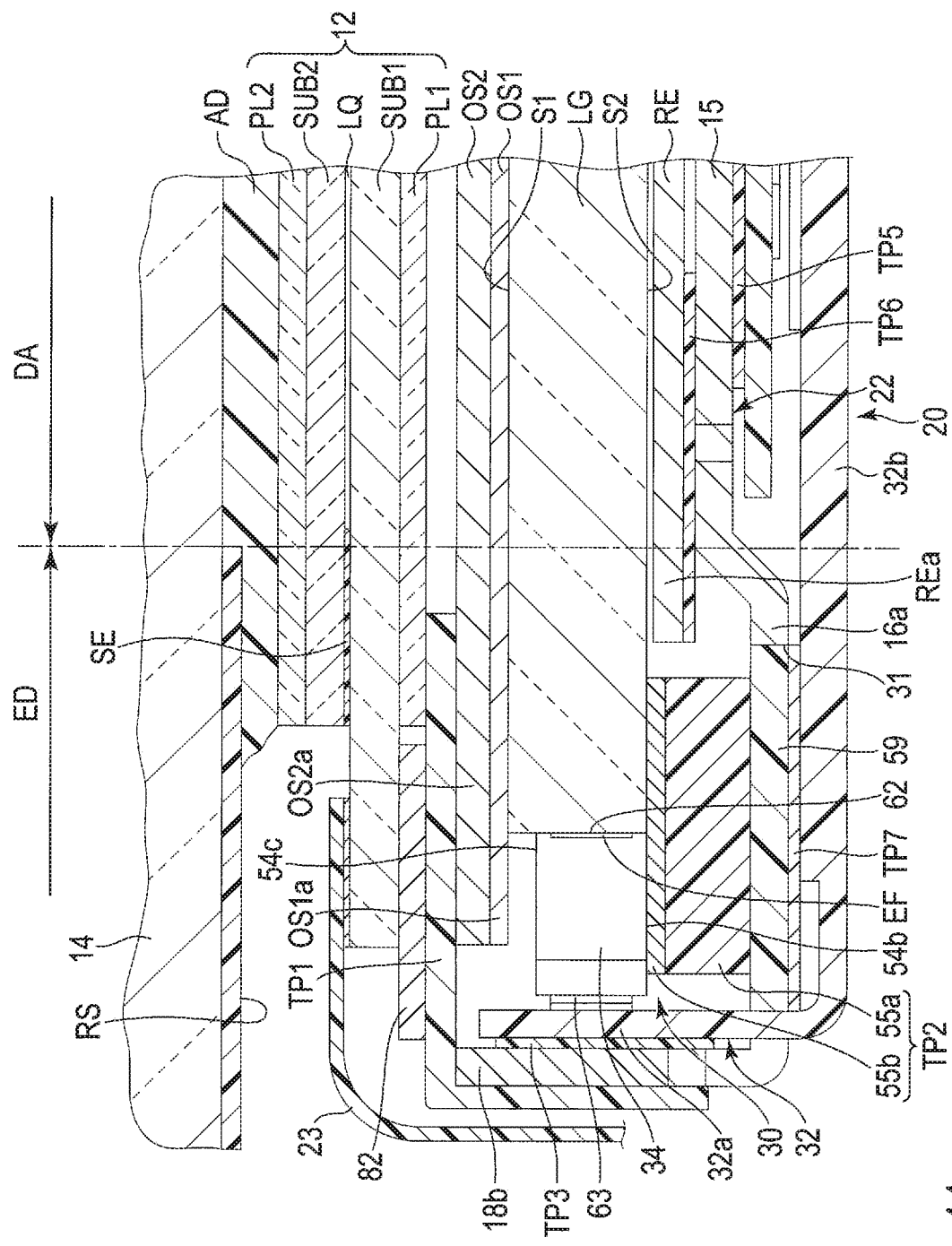
F I G. 11

US 10,551,556 B2

LIGHT SOURCE DEVICE AND LIGHT SOURCE UNIT COMPRISING THE SAME

CROSS-REFERENCE TO RELATED APPLICATIONS

This is a Continuation of application Ser. No. 15/658,095, filed Jul. 24 2017, and is based upon and claims the benefit of priority from Japanese Patent Applications No. 2016-149573, filed Jul. 29, 2016; and No. 2017-109469, filed Jun. 1, 2017, the entire contents of all of which are incorporated herein by reference.

FIELD

Embodiments described herein relate generally to a light source device used for a display device, and a light source unit comprising the same.

BACKGROUND

In recent years, liquid crystal display devices have been widely used as display devices of smartphones, personal digital assistants (PDAs), tablet computers, vehicle-navigation systems, etc. In general, a liquid crystal display device comprises a liquid crystal panel, and a backlight device overlaid on the rear surface of the liquid crystal panel and illuminating the liquid crystal panel. The backlight device includes a reflective layer, a light guide, an optical sheet, a light source unit which emits light incident on the light guide, a case (bezel) in which these members are accommodated, etc. The light source unit includes a wiring board and a plurality of light sources, for example, light-emitting diodes (LEDs) mounted on the wiring board.

As light source units, a side view type LED and top view type LED are known. In the side-view type LED, the light-emitting surface is provided normal to the mounting surface of the wiring board, whereas in the top-view type LED, the light-emitting surface is provided to face the mounting surface of the wiring board to be parallel thereto. In either type, normally, the LED comprises an LED chip which is the center of light emission, and a case (package) in which the LED chip is accommodated.

In recent years, in connection with the reduction in the thickness or size of backlight devices and liquid crystal display devices, the reduction in the size of each LED itself has been required. When the thickness or size of each LED is reduced, it is necessary to reduce the size of the package and the thickness of the walls of the package. However, when the thickness of the walls is reduced, light may leak out from the side surfaces other than the light-emitting surface. When light leaks out, the luminance near the light source unit may become nonuniform, thereby having a detrimental effect on the display quality.

BRIEF DESCRIPTION OF THE DRAWINGS

FIG. 3 is a cross-sectional view of the liquid crystal display device along line A-A of FIG. 1.

FIG. 11 is a cross-sectional view showing the light source side portion of the liquid crystal display device according to the second embodiment.

DETAILED DESCRIPTION

Figure 1:
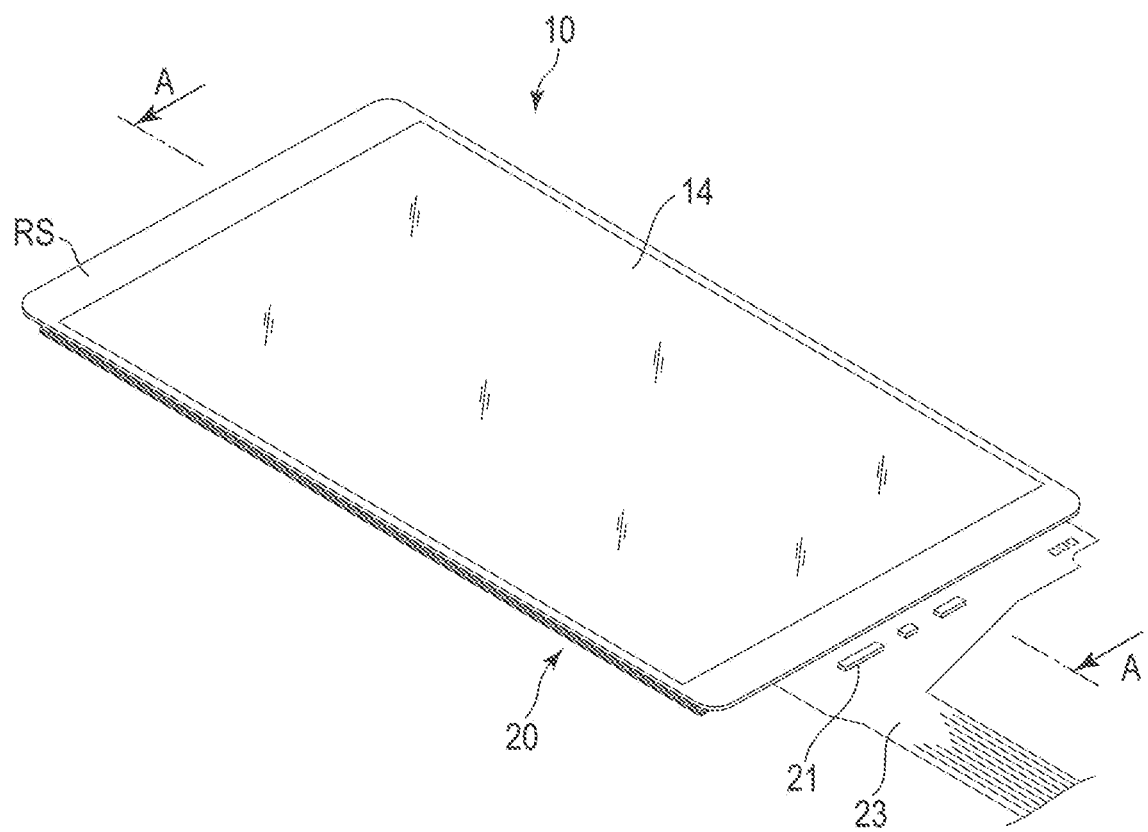
FIG. 1 is a perspective view showing the display surface side of a liquid crystal display device according to a first embodiment.

Various embodiments will be described hereinafter with reference to the accompanying drawings. In general, according to one embodiment, a light source device comprises a light-emitting chip, and a case in which the light-emitting chip is accommodated. The case comprises a light-emitting surface which transmits light from the light-emitting chip, and a plurality of sidewalls extending so as to intersect the light-emitting surface. At least a part of the sidewalls is colored or painted in black.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, the same structural elements as those described in connection with preceding drawings are denoted by like reference numbers, detailed description thereof being omitted unless necessary.

First Embodiment

A liquid crystal display 10 can be incorporated into various kinds of electronic devices such as smartphones, tablet computers, mobile phones, notebook computers, portable game consoles, electronic dictionaries, television sets and vehicle-navigation systems, to be used.

Figure 2:
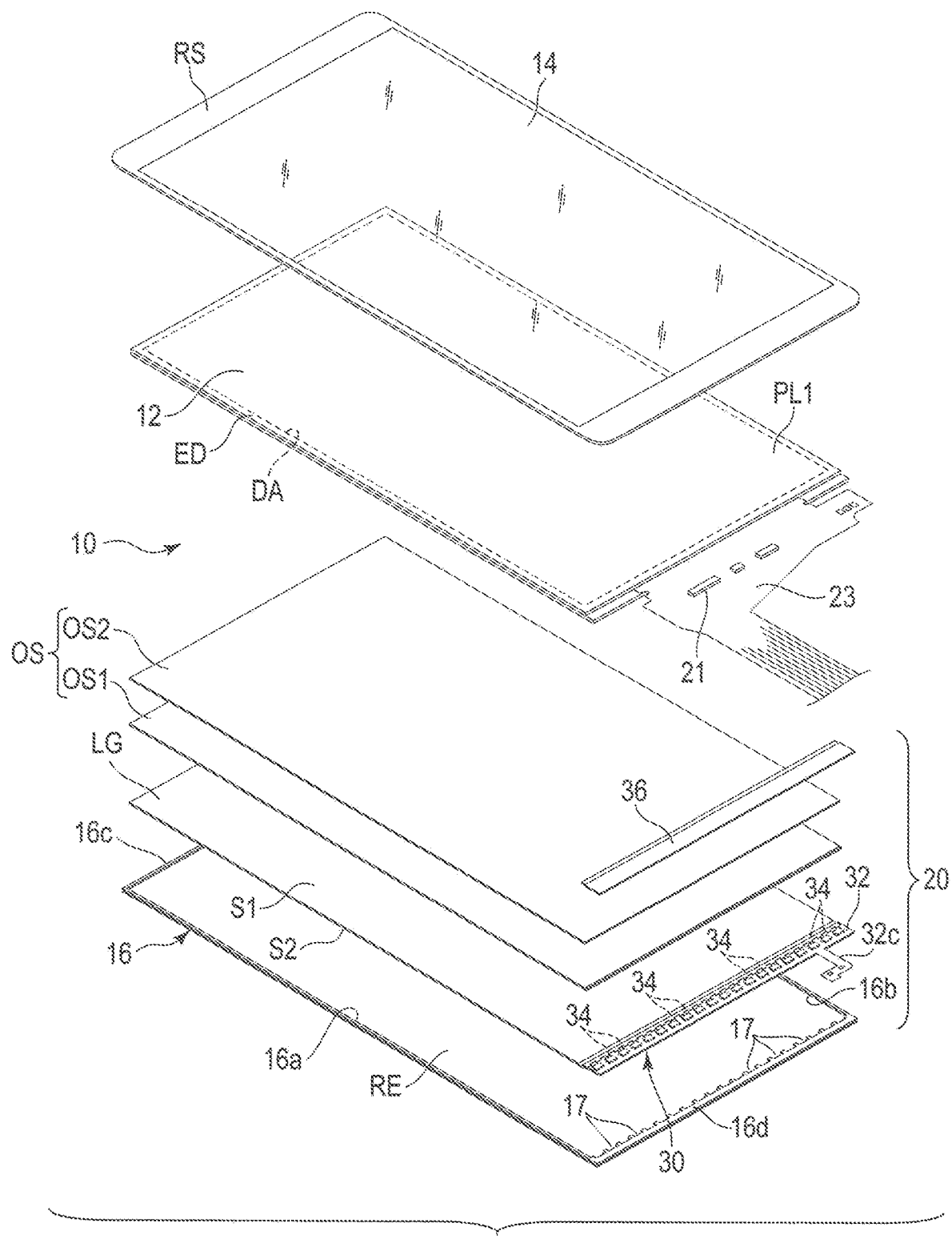
FIG. 2 is an exploded perspective view of the liquid crystal display device and a backlight device.

As shown in FIGS. 1 and 2, the liquid crystal display 10 comprises an active-matrix flat liquid crystal panel 12, a transparent cover panel 14 overlaid on a display surface 12a which is one flat surface of the liquid crystal panel 12 and configured to cover the entire display surface 12a, and a backlight unit (backlight device) 20 provided on the rear side of the liquid crystal panel 12 equivalent to the other flat surface of the liquid crystal panel 12 so as to face the rear side.

FIG. 3 is a cross-sectional view of the liquid crystal display device along line A-A of FIG. 1. As shown in FIGS. 2 and 3, the liquid crystal panel 12 comprises a rectangular flat first substrate SUB1, a rectangular flat second substrate SUB2 facing the first substrate SUB1, and a liquid crystal layer LQ sealed in between the first substrate SUB1 and the second substrate SUB2. The circumferential portion of the second substrate SUB2 is attached to the first substrate SUB1 with a sealing member SE. A polarizer PL1 is attached to the surface of the second substrate SUB2 to form the display surface 12a of the liquid crystal panel 12. A polarizer PL2 is attached to a surface (the rear surface of the liquid crystal panel 12) of the first substrate SUB1. The polarizer PL2 has dimensions slightly greater than those of the outline of the first substrate SUB1, and covers the entire surface of the first substrate SUB1.

On the liquid crystal panel 12, a rectangular display area (active area) DA is provided inside the sealing member SE as the liquid crystal panel 12 is seen in plan view (in other words, when the liquid crystal panel is seen from the normal direction of the display surface). An image is displayed on the display area DA. A rectangular frame area ED is provided around the display area DA. The liquid crystal panel 12 is a transmissive liquid crystal panel having a transmissive display function of displaying an image by selectively transmitting or modulating the light from the backlight unit 20 to the display area DA. The liquid crystal panel 12 may have a structure provided for the lateral electric field mode which mainly utilizes a lateral electric field parallel to the main surface of the substrate, or a structure provided for the vertical electric field mode which mainly utilizes a vertical electric field crossing the main surface of the substrate.

In the example illustrated, a flexible printed circuit board (main FPC) 23 is joined to a short-side end of the first substrate SUB1 so as to extend from the liquid crystal panel 12 outward. On the main FPC 23, semiconductor elements including a driver chip IC 21 are mounted as signal supply sources which supply signals necessary to drive the liquid crystal panel 12.

As shown in FIGS. 1 to 3, for example, the cover panel 14 is formed of a glass plate or acrylic transparent resin into the shape of a rectangular plate. The cover panel 14 has dimensions (a width and a length) greater than the dimensions of the liquid crystal panel 12 and an area greater than the area of the liquid crystal panel 12 as seen in plan view. The lower surface (rear surface) of the cover panel 14 is adhered to the display surface 12a of the liquid crystal panel 12 with a transparent adhesive material AD and covers the entire display surface 12a. The circumferential portion of the cover panel 14 projects to the external side in comparison with the outer circumference of the liquid crystal panel 12 in a state where the cover panel 14 is attached to the liquid crystal panel 12.

On the lower surface (the rear surface, the surface on the liquid crystal panel side) of the cover panel 14, a frame-shaped light-shielding layer RS is formed. In the cover panel 14, the region other than the region facing the display area DA is shielded by the light-shielding layer RS. The light-shielding layer RS may be formed on the upper surface (outer surface) of the cover panel 14.

As shown in FIGS. 2 and 3, the backlight unit 20 comprises a rectangular frame 16 attached to the rear surface of the liquid crystal panel 12, a reflective sheet RE attached to the rear surface of the frame 16, a plurality of optical members provided in the frame 16, and a light source unit 30 which emits light to the optical members.

The frame 16 is formed so as to have external dimensions (a width and a length) slightly greater than the external dimensions of the liquid crystal panel 12 and less than the external dimensions of the cover panel 14. A first adhesive layer 24a is formed on the lower surface of the frame 16. A second adhesive layer 24b is formed on the upper surface of the frame 16. The reflective sheet RE is adhered to the lower surface of the frame 16 with the first adhesive layer 24a, and covers the lower side of the frame 16. The reflective sheet RE has a thickness of 200 μm or less, preferably, 50 to 90 μm, and a reflectivity of 90% or higher, preferably, 95% or higher.

As shown in FIGS. 2 and 3, the backlight unit 20 includes, as the optical members accommodated in the frame 16, a light guide LG which is rectangular as seen in plan view, and optical sheets OS overlaid on the light guide LG. The backlight unit 20 further comprises a light source unit 30 provided along a side surface (incidence surface) of the light guide LG and emitting light to the light guide LG.

The light guide LG comprises a first main surface S1 functioning as an exit surface, a second main surface S2 on a side opposite to the first main surface S1, and a pair of long-side surfaces and a pair of short-side surfaces connecting the side edges of the first main surface S1 and the second main surface S2. In the present embodiment, one short-side surface of the light guide LG is the incidence surface EF. The light guide LG is formed so as to have dimensions (a length and a width) slightly less than the internal dimensions of the frame 16 and slightly greater than the dimensions of the display area DA of the liquid crystal panel 12. The thickness of the light guide LG is the greatest on the side surface (incidence surface EF) side facing the light source unit 30 and is the least on the other side surface side opposite to the incidence surface EF side. In the present embodiment, the entire second main surface S2 is flat. The first main surface S1 is the most distant from the second main surface S2 on the incidence surface EF side. In the region ranging from the incidence surface EF to a position a predetermined distance away from the incidence surface EF toward the opposite side surface, the first main surface S1 is inclined so as to be gradually closer to the second main surface S2 toward the opposite side surface. The first main surface S1 is formed as a surface parallel to the second main surface S2 between the position the predetermined distance away from the incidence surface EF and the opposite side surface.

The opposite side surface of the light guide LG has, for example, a thickness of approximately 0.2 to 0.5 mm (200 to 500 μm).

The light guide LG is overlaid on the reflective sheet RE in a state where the second main surface S2 faces the reflective sheet RE. The incidence surface EF faces a short-side portion 16d of the frame 16. The other side surfaces of the light guide LG face a short-side portion 16c and long-side portions 16a and 16b of the frame 16 across an intervening small gap of approximately 0.05 to 0.2 mm (50 to 200 μm).

The optical sheets OS have light transmission property, and are overlaid on the first main surface S1 of the light guide LG. In the present embodiment, the optical sheets OS are provided as, for example, a diffusion sheet OS1 and prism sheet OS2 formed of synthetic resin such as polyethylene terephthalate. These optical sheets OS are stacked on the first main surface S1 of the light guide LG in order. Each optical sheet OS has the same width as that of the light guide LG, and has a length slightly less than that of the light guide LG. Further, each optical sheet OS has dimensions slightly greater than those of the display area DA of the liquid crystal panel 12. The optical sheets OS face the rear surface of the liquid crystal panel 12 across an intervening small gap, and further face the entire display area DA.

As shown in FIGS. 2 and 3, the light source unit 30 comprises, for example, a slender belt-shaped wiring board 32, and a plurality of light source devices mounted on the writing substrate 32. As the light source devices, light-emitting elements, for example, light-emitting diodes (LEDs) 34 are employed. A flexible printed circuit (FPC) board is used for the wiring board 32. The wiring board 32 includes an insulating base formed of polyimide, etc., and a conductive layer formed of copper foil, etc., on the insulating base. The conductive layer is patterned to form a plurality of connection pads and wiring lines. The wiring board 32 comprises a connection end portion 32c extending from a side edge. The LEDs 34 are arranged in the longitudinal direction of the wiring board 32 (in other words, a direction parallel to the short-side portions of the frame 16).

One of the long-side portions of the wiring board 32 is adhered onto the short-side portion 16d of the frame 16 with the second adhesive layer 24a. The other long-side portion is located on the end portion of the light guide LG on the incidence surface EF side. In this way, the LEDs 34 are provided between the short-side portion 16d of the frame 16 and the incidence surface EF of the light guide LG, and face the incidence surface EF. In the present embodiment, the LEDs 34 are provided and positioned in concave portions 17 of the short-side portion 16d.

As shown in FIG. 3, for example, a double-faced tape 37 is attached from the end portion of the optical sheet OS2 on the light source side to the end portion of the wiring board 32 on the optical sheet side. The end portion of the lowest optical sheet OS1 on the light source side extends beyond an end portion of the optical sheet OS2 to the light source side, and is attached to the double-faced tape 37. In this manner, the optical sheets OS1 and OS2 are attached to the wiring board 32 with the double-faced tape 37.

Further, as shown in FIGS. 2 and 3, a slender belt-shaped third adhesive layer, for example, a double-faced tape 36 is overlaid on and attached onto the wiring board 32 and the end portion of the optical sheet OS.

Figure 4:
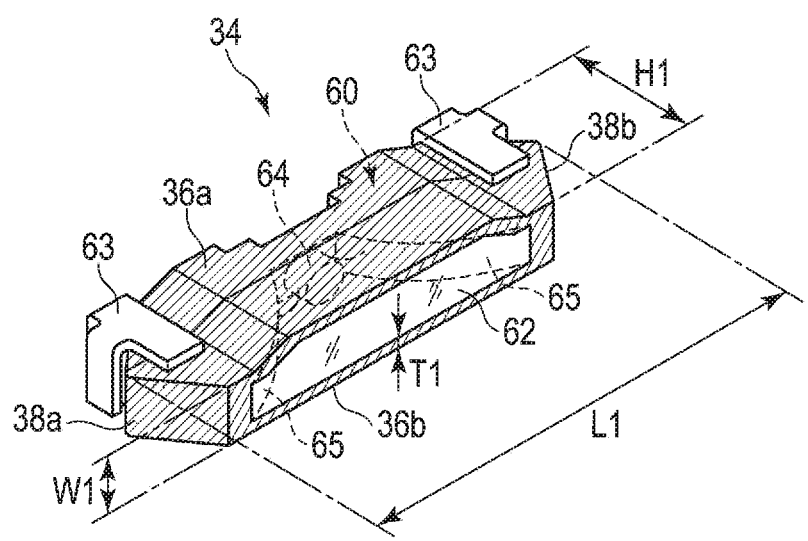
FIG. 4 is a perspective view showing the mounting surface side of a light source device (LED) provided in the liquid crystal display device.
Figure 5:
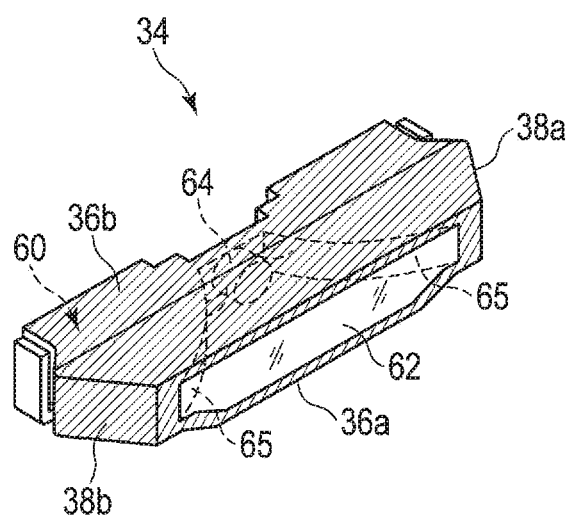
FIG. 5 is a perspective view showing the rear side of the light source device (LED).

FIG. 4 is a perspective view showing the mounting surface side of the LED 34. FIG. 5 is a perspective view showing the opposite side surface of the LED 34. In the present embodiment, the LEDs 34 are side-view LEDs.

As shown in FIGS. 3 to 5, the LED 34 comprises, for example, a case (package) 60 formed of resin and having the shape of substantially a rectangular parallelepiped. The upper surface of the case 60 forms a light-emitting surface 62 allowed to transmit light. The bottom surface is provided on a side opposite to the light-emitting surface 62. The case 60 comprises a plurality of sidewalls perpendicular to the light-emitting surface 62 and the bottom surface. The sidewalls include a pair of long-sidewalls 36a and 36b facing each other, and a pair of short-sidewalls 38a and 38b facing each other. The long-sidewall 36a forms the mounting surface. On the mounting surface, a pair of connection terminals 63 is provided. For example, an LED chip 64 which is a light-emitting element (light-emitting chip), a reflector 65, a phosphor or sealing resin and bonding wires connecting the LED chip 64 to the connection terminals are provided in the case 60.

The case 60 of the LED 34 has a width W1, a length L1 and a height (depth) H1. The thickness T1 of the long-sidewalls 36a and 36b is less than or equal to one-tenth of the width W1 of the case 60.

In the present embodiment, for example, the case 60 is formed of synthetic resin colored black with fine black particles, black ink, etc. The entire sidewalls of the case 60 are black excluding the light-emitting surface 62. In this way, the sidewalls of the case 60 have light-shielding property. The inner surface of the case 60 is preferably white. If possible, two colors may be applied to the case 60 with black resin and white resin. Instead of using black resin, the outer surface of the sidewalls of the case 60 may be painted or printed with black ink. Even in this case, it is possible to sufficiently obtain light-shielding property.

Further, all of the sidewalls of the case 60 may not be black. At least a part of the sidewalls, for example, the long-sided sidewall 36b should be black. In the present embodiment, the sidewall 36a forms the mounting surface, and is mounted on the wiring board 32. Thus, the sidewall 36a may not be black.

As shown in FIGS. 2 and 3, the LEDs 34 having the above structure are mounted such that the mounting surfaces are mounted on the wiring board 32, and the connection terminals 63 are electrically connected to the connection pads of the wiring board 32. The LEDs 34 are arranged in a line on the wiring board 32 in a state where the longitudinal direction of the case 60 is aligned with the longitudinal direction of the wiring board 32. The light-emitting surface 62 of each LED 34 is perpendicular to the mounting surface, in other words, the wiring board 32, and faces the incidence surface EF of the light guide LG.

The backlight unit 20 having the above structure is provided so as to face the rear surface of the liquid crystal panel 12, and is attached to the polarizer PL2 of the liquid crystal panel 12 with the second adhesive layer 24b and the double-faced tape 36.

As shown in FIGS. 2 and 3, the pair of long-side portions 16a and 16b of the frame 16 is attached to the long-side end portions of the rear surface of the polarizer PL2 with the second adhesive layer 24b. In this way, the pair of long-side portions 16a and 16b is provided along the long sides of the polarizer PL2. The short-side portion 16c of the frame 16 is attached to the short-side end portion of the rear surface of the polarizer PL2 with the second adhesive layer 24b. In this way, the short-side portion 16c is provided along the short side of the polarizer PL2. Thus, as seen in plan view, the long-side portions 16a and 16b and the short-side portion 16c of the frame 16 overlap the frame area ED of the liquid crystal panel 12, and are aligned with and flush with the pair of long sides and one of the short sides of the polarizer PL2.

The wiring board 32 attached to the short-side portion 16d of the frame 16 is also attached to the rear side of the first substrate SUB1 with the double-faced tape 36. In this way, the short-side portion 16d and the light source unit 30 overlap the frame area ED of the liquid crystal panel 12.

The optical sheets OS1 and OS2 and the light guide LG face the display area DA of the liquid crystal panel 12. The wiring board 32 is connected to the main FPC 23 via the connection end portion 32c. In this manner, drive current is supplied to the LEDs 34 via the main FPC 23 and the wiring board 32. The light emitted from the light-emitting surfaces 62 of the LEDs 34 enters the light guide LG through the incidence surface EF, and is transmitted through the light guide LG. Or, after the emission from the second main surface S2 of the light guide LG, the light is reflected on the reflective sheet RE, and enters the light guide LG again. Subsequent to this optical path, the light from the LEDs 34 is emitted from the entire first main surface (emission surface) S1 of the light guide LG to the liquid crystal panel 12. The emitted light is diffused by the optical sheets OS. Subsequently, the light is emitted to the display area DA of the liquid crystal panel 12.

According to the liquid crystal display device and the light source unit 30 having the above structure, each LED 34 as a light source device comprises the case (package) 60 formed of resin. At least a part of the case 60, here, the entire sidewalls excluding the light-emitting surface 62 are colored or painted in black. Thus, the light-shielding property of each case 60 is high. Even when each LED 34 is reduced in the size and thickness, and the thickness of the sidewalls 36a and 36b is extremely less, light leakage from the sidewalls can be prevented. It is possible to prevent light emission in an unnecessary direction from the LEDs 34, and assuredly cause light to enter the light guide LG. In this manner, the luminance near the light source unit 30 becomes uniform. As described above, according to the present embodiment, it is possible to provide a light source device capable of improving the display quality of a liquid crystal display device, and a light source unit comprising the light source device.

The shapes or dimensions of the LEDs are not limited to the above first embodiment, and may be modified in various ways.

Now, this specification explains a backlight device provided in a liquid crystal display device according to other embodiments. In the other embodiments described below, the same structural elements as those of the first embodiment are denoted by like reference numbers, detailed description thereof being omitted or simplified. Structural elements different from those of the first embodiment are mainly explained in detail.

Second Embodiment

Figure 6:
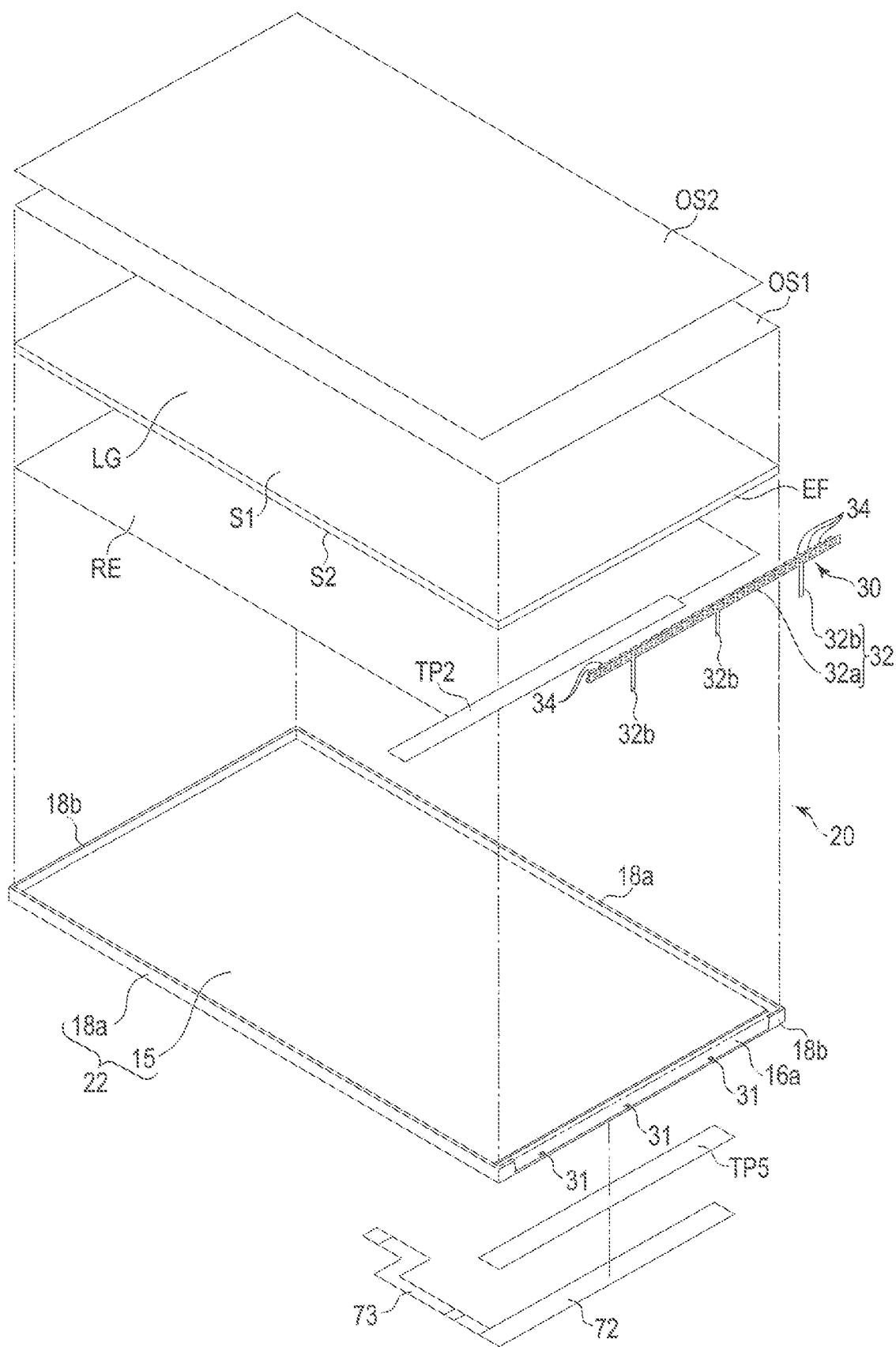
FIG. 6 is an exploded perspective view of a backlight device provided in a liquid crystal display device according to a second embodiment.

FIG. 6 is an exploded perspective view of a backlight unit provided in a liquid crystal display device according to a second embodiment. As shown in FIG. 6, a backlight unit 20 comprises a flat rectangular case (bezel) 22, a plurality of optical members arranged in the case 22, and a light source unit 30 which emits light to the optical members. The backlight unit 20 is provided so as to face the rear surface of a liquid crystal panel 12 and attached to the rear surface of the liquid crystal panel 12 with a frame-shaped sticking member, for example, a double-faced tape TP1.

The case 22 is formed into a flat rectangular shape by, for example, bending or press-molding a stainless plate material having a thickness of 0.1 mm. The case 22 integrally includes a rectangular bottom 15, and a pair of long-side walls 18a and a pair of short-side walls 18b provided upright on the side edges of the bottom 15. In the present embodiment, the bottom 15 comprises an end portion located on one of the short sides and facing the light source unit 30. This end portion of the bottom 15 is formed into a step portion (concave portion) 15a one step lower than the other portion, and slightly protrudes outwards, more specifically, to a direction away from the light source unit 30 accommodated in the case 22. As seen in plan view, the bottom 15 is formed so as to have dimensions (a length and a width) slightly greater than the dimensions of a first substrate SUB1 of the liquid crystal panel 12 and less than the dimensions of a cover panel 14.

The long-side walls 18a are provided substantially perpendicular to the bottom 15 and extend over the long sides of the bottom 15 in full length. The short-side walls 18b are provided substantially perpendicular to the bottom 15 and extend over the short sides of the bottom 15 in full length. The height of these side plates 18a and 18b from the bottom 15 is, for example, approximately 1 mm.

The bottom 15 comprises a plurality of, for example, three openings 31. The openings 31 are formed near one of the short sides of the bottom 15 and arranged to be spaced from each other along the short side. In the present embodiment, the openings 31 are provided in the step portion 15a of the bottom 15. The width of the openings 31 is greater than the thickness of the wiring board of the light source unit 30 as described later.

The backlight unit 20 includes, as optical members, a reflective sheet RE which is rectangular as seen in plan view, a light guide LG, and a plurality of, for example, two optical sheets, specifically, a first optical sheet OS1 and a second optical sheet OS2. The number of optical sheets is not limited to two. Three or more optical sheets may be used.

The reflective sheet RE is formed so as to have external dimensions substantially equal to the internal dimensions of the bottom 15 of the case 22. The reflective sheet RE has a thickness of 200 μm or less, preferably, 50 to 90 μm, and a reflectivity of 90% or higher, preferably, 95% or higher. The reflective sheet RE is provided on the bottom 15 so as to cover substantially the entire bottom 15 excluding the portions of the openings 31.

The rectangular light guide LG comprises a first main surface S1 functioning as an exit surface, a second main surface S2 on a side opposite to the first main surface S1, and a plurality of, for example, a pair of long-side surfaces and a pair of short-side surfaces connecting the side edges of the first main surface S1 and the second main surface S2. In the present embodiment, one of the short-side surfaces of the light guide LG is an incidence surface EF. The light guide LG has, for example, a thickness of approximately 0.23 to 0.32 mm. The light guide LG is formed of, for example, polycarbonate, or acrylic or silicon resin.

The light guide LG is formed so as to have external dimensions (a length and a width) slightly less than the internal dimensions of the case 22 and slightly greater than the dimensions of the display area DA of the liquid crystal panel 12 as seen in plan view. The light guide LG is accommodated in the case 22 and placed on the reflective sheet RE in a state where the second main surface S2 faces the reflective sheet RE. Thereby, the first main surface (emission surface) S1 of the light guide LG is located substantially parallel to the bottom 15, and the incidence surface EF is located substantially perpendicular to the bottom 15.

Figure 7:
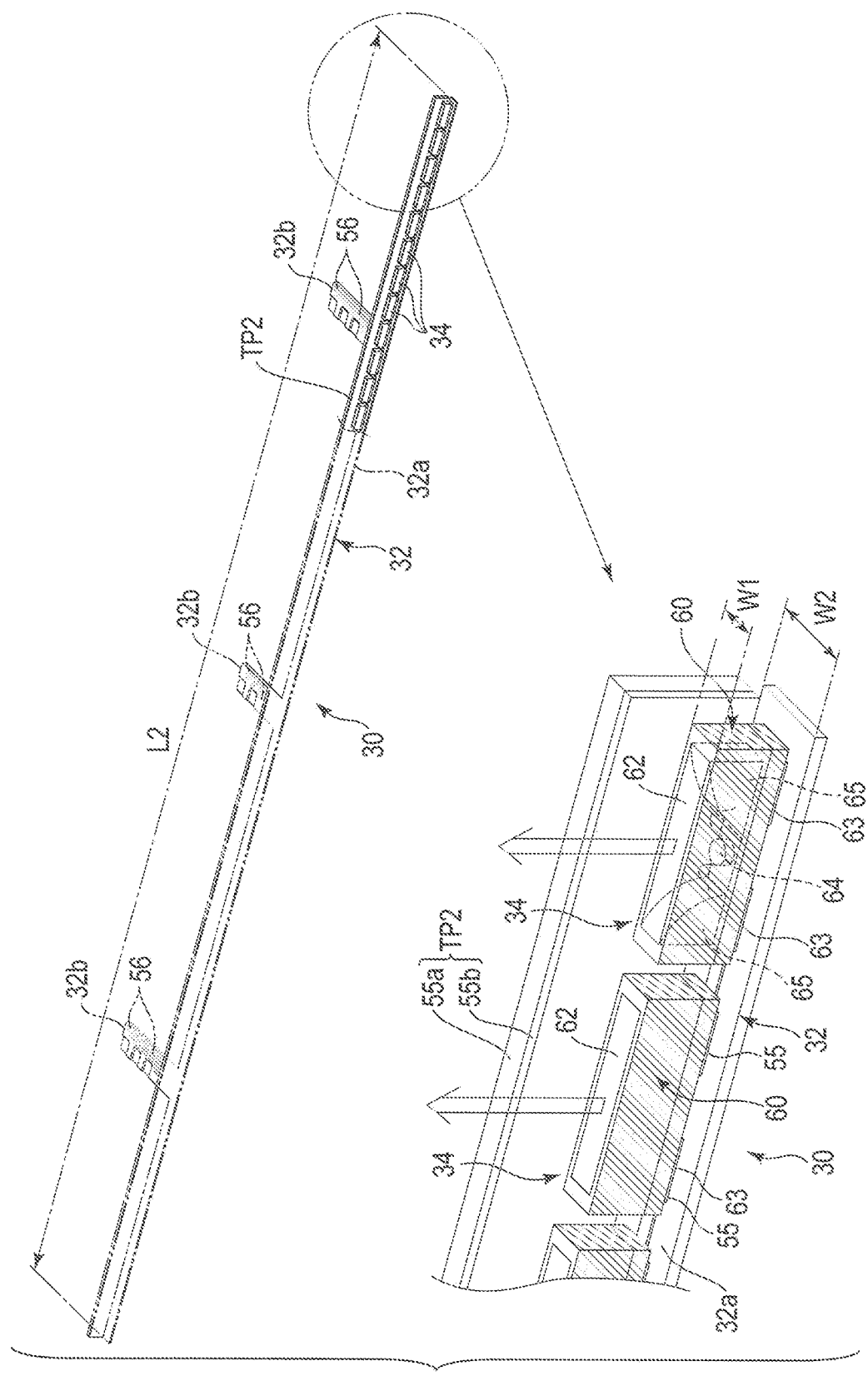
FIG. 7 includes a perspective view showing a light source unit provided in the backlight device according to the second embodiment, and a perspective view in which a part of the light source unit is enlarged.
Figure 8:
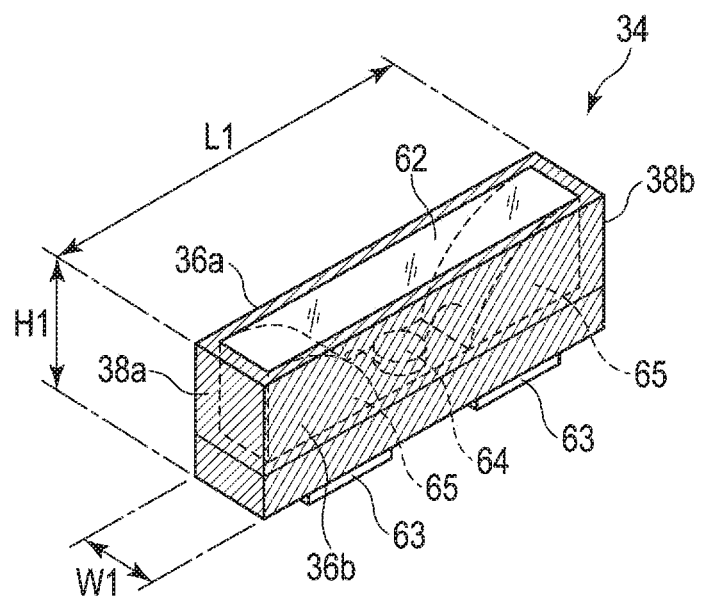
FIG. 8 is a perspective view showing the light-emitting surface side of a light source device (LED) provided in the light source unit.
Figure 9:
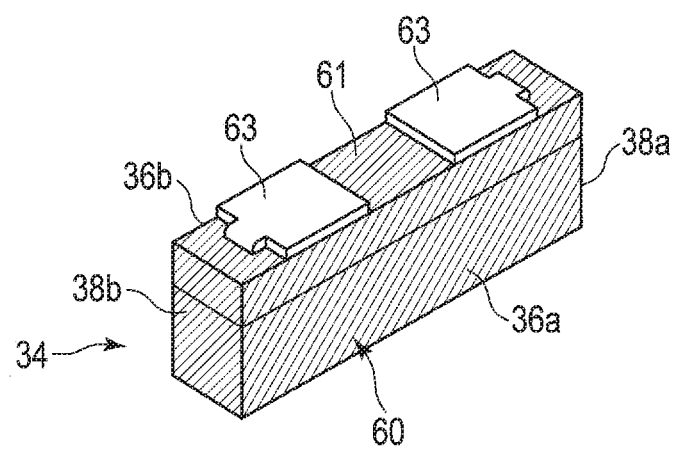
FIG. 9 is a perspective view showing the mounting surface side of the light source device (LED).

FIG. 7 includes a perspective view of the light source unit, and a perspective view in which a part of the light source unit is enlarged. FIG. 8 is a perspective view showing the light-emitting surface side of an LED. FIG. 9 is a perspective view showing the mounting surface side of the LED.

As shown in FIG. 7, the light source unit 30 comprises, for example, a slender belt-shaped wiring board 32 and a plurality of light source devices mounted and arranged on the wiring board 32. As the light source devices, light-emitting elements, for example, light-emitting diodes (LEDs) 34 are employed.

A flexible printed circuit (FPC) board is used for the wiring board 32. The wiring board 32 includes an insulating layer formed of polyimide, etc., and a conductive layer formed of copper foil, etc., on the insulating layer. The conductive layer is patterned to form a plurality of connection pads 55 and wiring lines 56.

The wiring board 32 integrally includes a belt-shaped mounting portion (mounting area) 32a extending along the side wall 18b of the case 22, and a plurality of, for example, three belt-shaped lead-out portions (wiring areas) 32b substantially perpendicularly extending from one side edge of the mounting portion 32a. The mounting portion 32a has a length L2 substantially equal to the length of the incidence surface EF. The three lead-out portions 32b are arranged to be spaced from each other in the longitudinal direction of the mounting portion 32a. The connection pads 55 are provided in the mounting portion 32a and are arranged in the longitudinal direction of the mounting portion 32a. The wiring lines 56 extend from the respective connection pads 55 to the lead-out portions 32b of the wiring board 32.

As shown in FIG. 7 to FIG. 9, in the present embodiment, the LEDs 34 are top-view type LEDs. Each LED 34 comprises, for example, a case (package) 60 formed of resin and having the shape of substantially a rectangular parallelepiped. The upper surface of the case 60 forms a light-emitting surface 62 allowed to transmit light. The bottom surface of the case 60 forms a mounting surface 61 on a side opposite to the light-emitting surface 62. The case 60 comprises a plurality of sidewalls perpendicular the light-emitting surface 62 and the bottom surface. The sidewalls include a pair of long-sidewalls 36a and 36b facing each other, and a pair of short-sidewalls 38a and 38b facing each other. A pair of connection terminals 63 is provided on the mounting surface 61. For example, an LED chip 64 which is a light-emitting element (light-emitting chip), a reflector 65, a phosphor or sealing resin and a bonding wire connecting the LED chip 64 to the connection terminals 63 are provided in the case 60.

In the present embodiment, for example, the case 60 is formed of synthetic resin colored black with fine black particles, black ink, etc. The entire sidewalls of the case 60 are black excluding the light-emitting surface 62. In this way, the case 60 has light-shielding property. The inner surface of the case 60 is preferably white. If possible, two colors may be applied to the case 60 with black resin and white resin. Instead of using black resin, the outer surface of the sidewalls of the case 60 may be painted or printed with black ink. Even in this case, it is possible to sufficiently obtain light-shielding property.

Further, the entire sidewalls of the case 60 may not be black. At least a part of the sidewalls, for example, the pair of long-sidewalls 36a and 36b should be black. In the present embodiment, the mounting surface 61 is mounted on the wiring board 32. Thus, the mounting surface 61 may not be black.

As shown in FIGS. 6 and 7, the LEDs 34 having the above structure are mounted such that the each mounting surface 61 is mounted on the mounting portion 32a of the wiring board 32, and the connection terminals 63 are electrically connected to the connection pads 55 of the wiring board 32. In accordance with the width of a display area AD, a plurality of, for example, thirty to fifty LEDs 34 are arranged on the wiring board 32 so as to form a line in a state where the longitudinal direction of the case 60 is aligned with the longitudinal direction of the wiring board 32. The light-emitting surface 62 of each LED 34 is parallel to the mounting surface 61, in other words, the wiring board 32. The width W2 of the mounting portion 32a is 1.1 to 1.5 times the width W1 of each LED 34.

In the present embodiment, a belt-shaped fixing tape TP2 is attached to the side surfaces of all the LED 34, as a sticking member for fixing and positioning each LED 34. The fixing tape TP2 is used such that approximately a half of the region in the width direction is attached to each LED 34, and the remaining half of the region is attached to the light guide LG. The fixing tape TP2 comprises a belt-shaped base 55a formed of, for example, polyethylene terephthalate (PET), and an adhesive layer 55b or sticking layer formed on at least one surface of the base 55a. Further, at least one of the base 55a and the adhesive layer 55b may be colored black with black ink, etc., to a light-shielding function.

Figure 10:
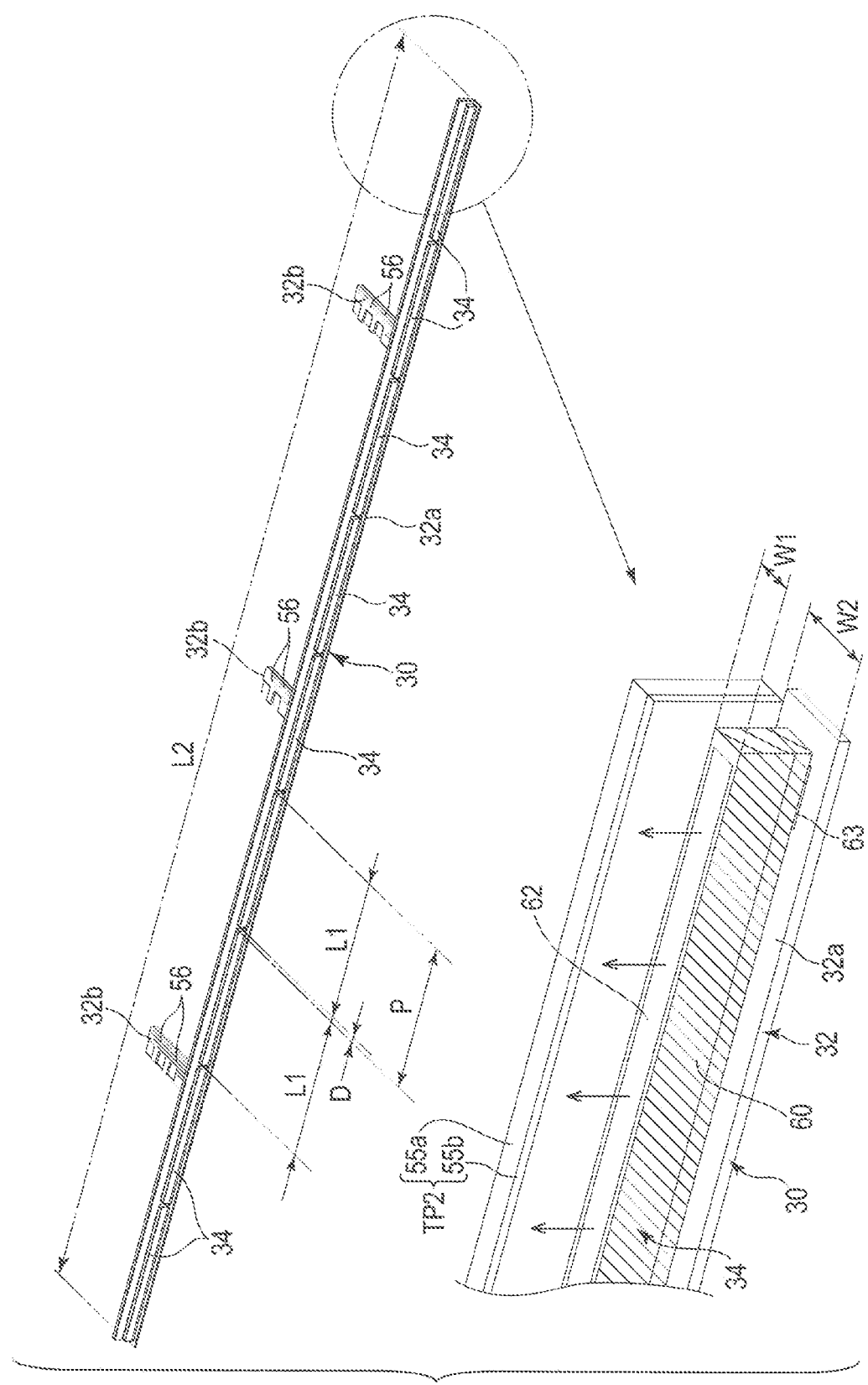
FIG. 10 is a perspective view showing an optical unit provided in a backlight unit according to a modification example.

The number of LEDs 34 mounted is not limited to thirty to fifty, but may be increased or decreased as needed. When longer LEDs are used, the number of LEDs to be mounted may be decreased. In the modification example shown in FIG. 10, the length L1 of each LED 34 is set to approximately 4 to 5 times that of each LED 34 shown in FIG. 7. The width W2 of the mounting portion 32a of the wiring board 32 is 1.1 to 1.5 times the width W1 of each LED 34. The arrangement pitch P of the LEDs 34 is set to approximately 1.1 to 1.5 times the length L1 of each LED 34. The gap D between adjacent LEDs 34 is set to approximately 10 to 50% of the length L1 of each LED 34.

FIG. 11 is a cross-sectional view of the light source side portion of the liquid crystal display device. As shown in FIG. 11, the light source unit 30 is provided in the case 22. The mounting portion 32a of the wiring board 32 and the LEDs 34 are arranged between the incidence surface EF of the light guide LG and the side wall 18b of the case 22. The light-emitting surfaces 62 of the LEDs 34 face or are in direct contact with the incidence surface EF of the light guide LG. The mounting portion 32a is attached to the inner surface of the side wall 18b with a sticking member, for example, a double-faced tape TP3. The mounting portion 32a faces the incidence surface EF across the intervening LEDs 34. Note that the sticking member is not limited to the double-faced tape TP3. For example, a UV-curing adhesive may be used. The light emitted from the LEDs 34 contains light of an ultraviolet region, and therefore it can cure the UV-curing adhesive with this ultraviolet ray.

The fixing tape TP2 is attached to the side surfaces of all the LEDs 34 (the side surface of the case 22 on the bottom 15 side) and the second main surface S2 of the light guide LG. Of the side surfaces of each LED 34, a long-side surface 54b located on the bottom 15 side is arranged to be substantially flush with the second main surface S2. The fixing tape TP2 is used such that approximately a half of the region in the width direction is attached to the side surface 54b of the LED 34, and the remaining half of the region is attached to the incidence surface side end portion of the second main surface S2 of the light guide LG. Each LED 34 comprises a light emission center at a position of an equal distance from both the light-emitting surface 62 and the mounting surface. The fixing tape TP2 covers a region of the side surface 54b of the LED 34 facing the emission center. Further, the fixing tape TP2 is adjacent to the reflective sheet RE in the surface direction of the light guide LG. The fixing tape TP2 extends to the vicinity of the light source side end portion REa of the reflective sheet RE, and is adjacent to the reflective sheet RE across an intervening small gap. Thus, the LEDs 34 are fixed to the light guide LG via the fixing tape TP2, and each light-emitting surface 62 is positioned to be in direct contact with the incidence surface EL of the light guide LG.

According to the present embodiment, the fixing tape TP2 is formed to be thicker than the reflective sheet RE, and is placed in the step portion 15a of the bottom 15. The fixing tape TP2 is in direct contact with the inner surface of the bottom 15 and covers at least a part of each of the openings 31.

As shown in FIGS. 6 and 11, a belt-shaped connection FPC 72 is attached to the rear surface of the bottom 15 with a double-faced tape TP5. The connection FPC 72 extends along the short side of the bottom 15 on the light source side.

The connection FPC 72 includes a connection portion 73. A connector 74 is provided at the extending end of the connection portion 73.

The three lead-out portions 32b of the wiring board 32 penetrate through the respective openings 31 of the bottom 15 so as to lead out from the rear side of the bottom 15, and are further bent to the bottom 15 side so as to face the rear surface of the bottom 15. The lead-out end portion of each lead-out portion 32b is joined to the connection FPC 72 by, for example, solder. Thereby, the wiring lines 56 of the wiring board 32 are electrically connected to the wiring lines of the connection FPC 72.

A belt-shaped reinforcing double-faced tape TP7 is attached to the rear surface of the bottom 15. The tape TP7 extends along the short side of the bottom 15 on the light source side so as to cover a part of each of the openings 31. The lead-out portions 32b led out from the rear side via the openings 31 are bent, and the tape TP7 is applied thereon. Thus, the lead-out portions 32b are held in the bent state.

Furthermore, in the present embodiment, a part of the reinforcing double-faced tape TP7 extends while blocking each of the openings 31 of the bottom 15, and is in direct contact with the fixing tape TP2 via a spacer 59 provided in the opening 31.

As the first optical sheet OS1 and the second optical sheet OS2 of the backlight unit 20, a phototransmissive diffusion sheet and a phototransmissive prism sheet formed of, for example, synthetic resin such as polyethylene terephthalate, are used. As shown in FIG. 11, the first optical sheet OS1 is formed into a rectangular shape having external dimensions slightly greater (longer) than the external dimensions of the light guide LG. The first optical sheet OS1 is overlaid on the first main surface S1 of the light guide LG so as to cover the entire first main surface S1. Similarly, the second optical sheet OS2 is formed into a rectangular shape having external dimensions slightly greater (longer) than the external dimensions of the light guide LG. The second optical sheet OS2 is overlaid on the first optical sheet OS1 so as to cover substantially the entire first optical sheet OS1.

The first optical sheet OS1 comprises an end portion OS1a on one of the short sides. The end portion OS1a extends beyond the incidence surface EF of the light guide LG to a position facing the LEDs 34. The end portion OS1a extends to the region facing the light emission center of each LED 34. The second optical sheet OS2 comprises an end portion OS2a on the light source side. The end portion OS2a extends slightly beyond the incidence surface EF of the light guide LG. The end portion OS2a overlaps the end portion OS1a of the first optical sheet OS1.

The backlight unit 20 having the above structure is attached to the rear surface of the liquid crystal panel 12 with the frame-shaped double-faced tape TP1. The double-faced tape TP1 is attached to the end edges of the side walls 18a and 18b and the outer peripheral portion of the second optical sheet OS2. As shown in FIG. 11, a part of the double-faced tape TP1 is bent to the bottom 15 and adhered to the outer surface of the side wall 18b on the light source side. Furthermore, in the liquid crystal panel 12, the double-faced tape TP1 is attached to the peripheral portion of a polarizer PL1 and the peripheral portion of the first substrate SUB1 across an intervening spacer 82.

The main FPC23 extending from the liquid crystal panel 12 is folded back to the rear side of the bottom 15 along the side plate 18b of the case 22. The main FPC23 is adhered to the bottom 15 with a sticking member (not shown).

In the liquid crystal display device having the above structure, the light source unit 30 employs the top-view LEDs 34. Thus, the wiring board 32 of the light source unit 30 can be disposed to face the incidence surface EF of the light guide LG across the intervening LEDs 34. With this structure, the wiring board 32 does not interfere with the optical members such as the optical sheets and the light guide and the display area DA of the liquid crystal panel 12. Thus, the frame area ED on the light source side can be dramatically reduced.

The end portion OS1a of the optical sheet OS1 on the light source side and the end portion OS2a of the optical sheet OS2 on the light source side are arranged along the first main surface S1 of the light guide LG. Thus, the end portions are not warped or bent. As a result, an unexpected light path is not formed in these portions, and therefore it becomes easy to manage the light path from the LEDs 34.

According to the liquid crystal display device and the light source unit 30, each LED 34 as a light source device comprises the case (package) 60 formed of resin. At least a part of the case 60, here, the entire sidewalls excluding the light-emitting surface 62 are colored or painted in black. Thus, the light-shielding property of the case 60 is high. Even when each LED 34 is reduced in the size and thickness, and the thickness of the sidewalls 36a and 36b is extremely less, light leakage from the sidewalls can be prevented. Light emission in an unexpected direction from each LED 34 can be prevented as much as possible. Thus, unexpected light leakage, etc., can be prevented. In this manner, the luminance near the light source unit 30 becomes uniform. As described above, according to the present embodiment, it is possible to provide a light source device capable of improving the display quality of a liquid crystal display device, and a light source unit comprising the light source device.

The shapes or dimensions of the LEDs are not limited to those of the above first embodiment, and may be modified in various ways.

Third Embodiment

Figure 12:
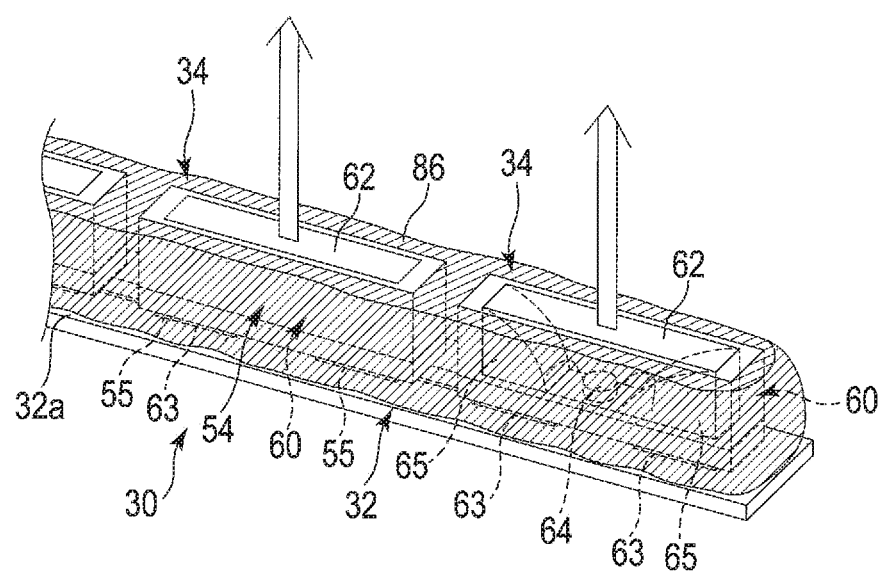
FIG. 12 is a perspective view showing a light source unit provided in a backlight device according to a third embodiment.

FIG. 12 is a perspective view showing a part of a light source unit provided in a liquid crystal display device according to a third embodiment.

In the present embodiment, a light source unit 30 comprises a wiring board 32, a plurality of LEDs 34 mounted and arranged on the wiring board 32, and a black resinous member 86 filled around the wiring board 32 and the LEDs 34 and covering the surrounding area of the LEDs 34 excluding light-emitting surfaces 62. The outer surfaces of the sidewalls of a case 60 of each LED 34 are covered with the black resinous member 86. The black resinous member 86 blocks light leaking out from the side surfaces of the LEDs 34, and prevents light emission in an unnecessary direction. In the third embodiment, the case 60 of each LED 34 may be formed of either white resin or black resin.

According to the third embodiment having the above structure, unnecessary light leaking out from the LEDs is blocked. Thus, the luminance near the light source can be made uniform. In this way, it is possible to provide a light source unit capable of improving the display quality of a liquid crystal display device. In the present embodiment, the other structures of the light source unit 30 and the liquid crystal display device are the same as those of the liquid crystal display device of the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The external and internal shapes of the structural members of the liquid crystal panel and the backlight unit are not limited to a rectangle. One or both of them may be polygonal, circular, elliptical or combination of any of these in plan view. The materials or dimensions of the structural members are not limited to those described in the examples provided above, and may be selected from various types.

What is claimed is:

1. A display device comprising:
a display panel; and
a backlight unit facing a back side of the display panel, the backlight unit comprising:
a plurality of light-emitting diodes, each of which includes a light-emitting chip, and a package without a light-emitting surface surrounding the light emitting chip, the package being colored or painted in black,
a wiring board on which the light-emitting diodes are arranged,
a light guide including an incident surface facing the light-emitting surfaces of the light-emitting diodes, and a light exit surface crossing the incident surface, and
a case in which the light-emitting diodes, the wiring board, and the light guide are housed.

2. The display device of claim 1, wherein
a part of the package of each of the light-emitting diodes protrudes from an end edge of the display panel in a plan view.

3. The display device of claim 2, further comprising:
a spacer provided between the light-emitting diodes and the end edge.

4. The display device of claim 3, further comprising:
a tape provided between the case and the end edge, the tape overlapping the light-emitting diodes.

5. The display device of claim 4, further comprising:
a tape extended to cover a side surface of the case and the light-emitting diodes from a position against the incident surface of the light guide.

6. The display device of claim 4, wherein
the tape fixes the display panel to the case.

7. The display device of claim 4, wherein
the tape has a light-shielding property.

8. A backlight unit comprising:
a plurality of light-emitting diodes, each of which includes a light-emitting chip, and a package without a light-emitting surface surrounding the light emitting chip, the package being colored or painted in black,
a wiring board on which the light-emitting diodes are arranged,
a light guide including an incident surface facing to the light-emitting surfaces of the light-emitting diodes, and a light exit surface crossing the incident surface, and
a case in which the light-emitting diodes, the wiring board and the light guide are housed.

* * * * *